(12) United States Patent
Seyama

(10) Patent No.: US 7,578,421 B2
(45) Date of Patent: Aug. 25, 2009

(54) HORN-HOLDER PIVOT TYPE BONDING APPARATUS

(75) Inventor: Kohei Seyama, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 243 days.

(21) Appl. No.: 11/714,560

(22) Filed: Mar. 6, 2007

(65) Prior Publication Data

US 2007/0205252 A1 Sep. 6, 2007

(30) Foreign Application Priority Data

Mar. 6, 2006 (JP) ............... 2006-058925

(51) Int. Cl.
 *B23K 20/10* (2006.01)
(52) U.S. Cl. ............ 228/1.1; 228/180.5; 228/4.5; 228/904; 228/110.1
(58) Field of Classification Search ............ 228/180.5, 228/4.5, 904, 110.1, 1.1
See application file for complete search history.

(56) References Cited

U.S. PATENT DOCUMENTS 5,156,320 A * 10/1992 Yanagida .............. 228/102

FOREIGN PATENT DOCUMENTS

| JP | 2003-347349 | 12/2003 |
|----|-------------|---------|
| JP | 2005-236104 | 9/2005  |

* cited by examiner

*Primary Examiner*—Jessica L Ward
*Assistant Examiner*—Erin B Saad
(74) *Attorney, Agent, or Firm*—William L. Androlia; H. Henry Koda

(57) ABSTRACT

A horn-holder pivot type bonding apparatus including a horn holder for holding an ultrasonic horn, and a motor for driving the horn holder to pivot, with an imaginary pivot point of the horn holder being positionally fixed on a bonding surface. The motor is provided substantially in the center of the upper portion of the horn holder. The horn holder is formed with circular arc sections in the forward and rearward portions with respect to the imaginary pivot point; and a bonding head has, at portions corresponding to the circular arc sections of the horn holder, forward and rearward cams so that the cams are pivotable by supporting shafts. The forward and rearward cams have circular arc sections that contact the circular arc sections of the horn holder, the circular arc shape of the circular arc sections of the forward and rearward cams being centered on the supporting shafts.

15 Claims, 5 Drawing Sheets

US 7,578,421 B2

HORN-HOLDER PIVOT TYPE BONDING APPARATUS

BACKGROUND OF THE INVENTION

The present invention relates to a horn-holder pivot type bonding apparatus wherein the imaginary pivot point of the horn holder during bonding operation can be positionally fixed on a bonding surface.

Japanese Patent Application Unexamined Publication Disclosure Nos. 2003-347349 and 2005-236104, for example, disclose horn-holder pivot type bonding apparatuses. In these bonding apparatuses, it is designed so that the bonding head can be set at a higher position than the work plane, so that, even when the bonding area is large and broad, long-size ultrasonic horn and/or horn holder is not required. Accordingly, in the bonding apparatuses disclosed in the above-identified relevant art, it is possible to suppress the increases in the inertia of the ultrasonic horn and horn holder and to make the high speed operation of the bonding apparatuses possible.

More specifically, the bonding apparatus disclosed in Japanese Patent Application Unexamined Publication Disclosure No. 2003-347349 includes an ultrasonic horn having a capillary attached to a tip end thereof, a horn holder holding this ultrasonic horn, a drive motor provided at the rear end portion of the horn holder for driving the horn holder, and a bonding head that has a circular arc shaped window structure for supporting portions provided on both sides of the horn holder. The center of the circular arc shape of the circular arc window is set on a plane of the bonding surface, and the supporting portions of the horn holder are moved in a circular arc shape along the circular arc window of the bonding head.

In the apparatus of Japanese Patent Application Unexamined Publication Disclosure No. 2005-236104, circular arc shaped rotary shafts of rotary motors that rotate about the center of rotation of the horn holder are respectively secured on both sides of the horn holder, and rotary shafts of circular arc shaped bearings that rotate about the above-described center of rotation are provided so as to rotate on the outside of the rotary motors integrally with the rotary shafts of the rotary motors.

In the bonding apparatus of Japanese Patent Application Unexamined Publication Disclosure No. 2003-347349, the lengths of the ultrasonic horn and horn holder can be made shorter, so that the moment of inertia of rotationally movable portions including the drive motor, the ultrasonic horn and horn holder is small. However, in this structure, the drive motor is provided at the rear end portion of the horn holder that is distant from the center of rotation of the horn holder; accordingly, there is a limitation to the reduction of the moment of inertia.

In the bonding apparatus described in Japanese Patent Application Unexamined Publication Disclosure No. 2005-236104, the rotary motors are provided on both sides of the horn holder, and thus the moment of inertia is reduced even further. However, since the rotary shafts of the rotary motors are provided on both sides of the horn holder, and bearings are provided on the outer side of such motors, the size increase in the bonding apparatus is inevitable.

Furthermore, in both of Japanese Patent Application Unexamined Publication Disclosure Nos. 2003-347349 and 2005-236104, no consideration is given to the rigidity against the acceleration of the rotationally movable portions in an X axis direction which is a horizontal direction horizontally at right angles with respect to the axial direction of the horn holder (the X axis direction thus being perpendicular to the surface of the drawing sheet).

BRIEF SUMMARY OF THE INVENTION

Accordingly, it is a first object of the present invention to provide a horn-holder pivot type bonding apparatus in which the moment of inertia of rotationally movable portions including a drive motor, ultrasonic horn and horn holder is reduced and, also, the bonding apparatus is downsized.

It is a second object of the present invention to provide a horn-holder pivot type bonding apparatus in which sufficient rigidity against the acceleration of the rotationally movable portions in the X axis direction (which is, as described above, a horizontal direction horizontally at right angles with respect to the axial or lengthwise direction of the horn holder and thus being perpendicular to the surface of the drawing sheet) is obtainable.

The above-described first object is accomplished by a unique structure of the present invention for a horn-holder pivot type bonding apparatus that includes:
  a capillary;
  an ultrasonic horn holding the capillary at one end thereof;
  a horn holder holding another end of the ultrasonic horn; and
  a drive means for driving the horn holder to pivot about a virtual pivot point positionally fixed on a bonding surface, the drive means being provided at substantially the center of the upper portion of the horn holder or above the rear-side portion of the horn holder.

The above-described first object is further accomplished by another unique structure of the present invention for a horn-holder pivot type bonding apparatus that includes:
  a capillary;
  an ultrasonic horn holding the capillary at one end thereof;
  a horn holder holding another end of the ultrasonic horn, the horn holder being provided with each of circular arc sections at a forward portion and at a rearward portion thereof, and each circular arc shape of the circular arc section being centered on a virtual pivot point positionally fixed on a bonding surface;
  a drive means for driving the horn holder to pivot about the virtual pivot point, the drive means being provided at substantially the center of the upper portion of the horn holder or above the rear-side portion of the horn holder; and
  a bonding head driven in XY directions and provided with each of forward and rearward cams pivotally supported by supporting shafts at portions corresponding to the circular arc sections of the horn holder, each of the cams having circular arc sections in contact with each of the circular arc sections of the horn holder, and each circular arc shape of the circular arc section of the cam being centered on each of the supporting shafts.

In the above-described structure of the horn-holder pivot type bonding apparatus of the present invention,
  the circular arc section of the forward portion of the horn holder and the circular arc section of the forward cam of the bonding head are connected by cross plate springs, and
  the circular arc section of the rearward portion of the horn holder and the circular arc section of the rearward cam of the bonding head are connected by cross plate springs.

The above-described first and second objects are accomplished by a unique structure of the present invention for a horn-holder pivot type bonding apparatus that includes:
  a capillary;
  an ultrasonic horn holding the capillary at one end thereof;

a horn holder holding another end of the ultrasonic horn, the horn holder being provided with each of circular arc sections at a forward portion and at a rearward portion thereof, and each circular arc shape of the circular arc section being centered on a virtual pivot point positionally fixed on a bonding surface;

a drive means for driving the horn holder to pivot about the virtual pivot point, the drive means being provided at substantially the center of the upper portion of the horn holder or above the rear-side portion of the horn holder;

a bonding head driven in XY directions and provided with each of circular arc sections at portions corresponding to the circular arc sections of the horn holder, each circular arc shape of the circular arc section of the bonding head being centered on the virtual pivot point, and each of the circular arc sections of the bonding head being separated by a certain distance from the circular arc sections of the horn holder; and a plurality of columnar elements respectively provided between the circular arc sections of the horn holder and the circular arc sections of the bonding head, each of the circular arc sections of the horn holder and each of the circular arc sections of the bonding head being connected by cross plate springs with the columnar elements in between.

The above-described first object is further accomplished by another unique structure of the present invention for a horn-holder pivot type bonding apparatus that includes:

a capillary;

an ultrasonic horn holding the capillary at one end thereof;

a horn holder holding another end of the ultrasonic horn, the horn holder being provided with each of forward and rearward cams pivotally supported by supporting shafts at a forward portion and at a rearward portion thereof, each of the cams being formed with circular arc sections, and each circular arc shape of the circular arc section of the cam being centered on each of the supporting shafts;

a drive means for driving the horn holder to pivot about a virtual pivot point positionally fixed on a bonding surface, the drive means being provided at substantially the center of the upper portion of the horn holder or above the rear-side portion of the horn holder; and a bonding head driven in XY directions and provided with each of circular arc sections at portions corresponding to the circular arc sections of each of the cams, each circular arc shape of the circular arc section of the bonding head being centered on the virtual pivot point, and each of the circular arc sections of the bonding head being in contact with each of the cams.

In the structure of this bonding apparatus of the present invention, the circular arc sections of each of the cams and the circular arc sections of the bonding head are connected by cross plate springs.

The above-described first object is further accomplished by still another unique structure of the present invention for a horn-holder pivot type bonding apparatus that includes:

a capillary;

an ultrasonic horn holding the capillary at one end thereof;

a horn holder holding another end of the ultrasonic horn, the horn holder being provided with each of circular arc sections so as to contact each of circular arc sections of each of forward and rearward cams pivotally supported by supporting shafts at portions corresponding to the circular arc sections of each of the cams, each circular arc shape of the circular arc section of the horn holder being centered on a virtual pivot point positionally fixed on a bonding surface, and the horn holder being provided above each of the supporting shafts;

a drive means for driving the horn holder to pivot about the virtual pivot point, the drive means being provided at substantially the center of the upper portion of the horn holder or above the rear-side portion of the horn holder; and a bonding head provided with a horn holder support above the virtual pivot point, the horn holder support being provided with each of the cams pivotally supported by the supporting shafts, each of the cams having circular arc sections, and each circular arc shape of the circular arc section being centered on each of the supporting shafts.

In the structure of this bonding apparatus of the present invention, the circular arc sections of each of the cams and the circular arc sections of the horn holder are connected by cross plate springs.

In the bonding apparatus of the present invention, the drive means can be a motor having a pulling force between a stator thereof and a movable element thereof, and one of the stator and movable element is secured to one of the horn holder and a member that pivots together with the horn holder, and other of the stator and movable element is secured to the bonding head driven in the XY directions.

Furthermore, in the structure of this bonding apparatus of the present invention, particularly in the structure in which the bonding head has a horn holder support, the drive means can be a motor that has no pulling force between a stator thereof and a movable element thereof, and one of the stator and movable element is secured to the horn holder, and other of the stator and movable element is secured to the bonding head driven in the XY directions.

Furthermore, in the bonding apparatus of the present invention, the opposing surfaces of the stator and movable member are respectively formed in a circular arc shape centered on the virtual pivot point.

As seen from the above, in the bonding apparatus of the present invention, a motor is provided at substantially the center of the upper portion of the horn holder or is provided above the rear-side portion of the horn holder. Accordingly, the moment of inertia when the capillary is driven up and down can be reduced, and the bonding apparatus can be made smaller or downsized. In addition, the horn holder and the forward and rearward cams are connected by cross plate springs. Accordingly, due to such cross plate springs, sufficient rigidity against the acceleration in the X axis direction is obtained.

DETAILED DESCRIPTION OF THE INVENTION

Hereinafter, preferred embodiments of the present invention will be concretely described with reference to the accompanying drawings.

Figure 1A:
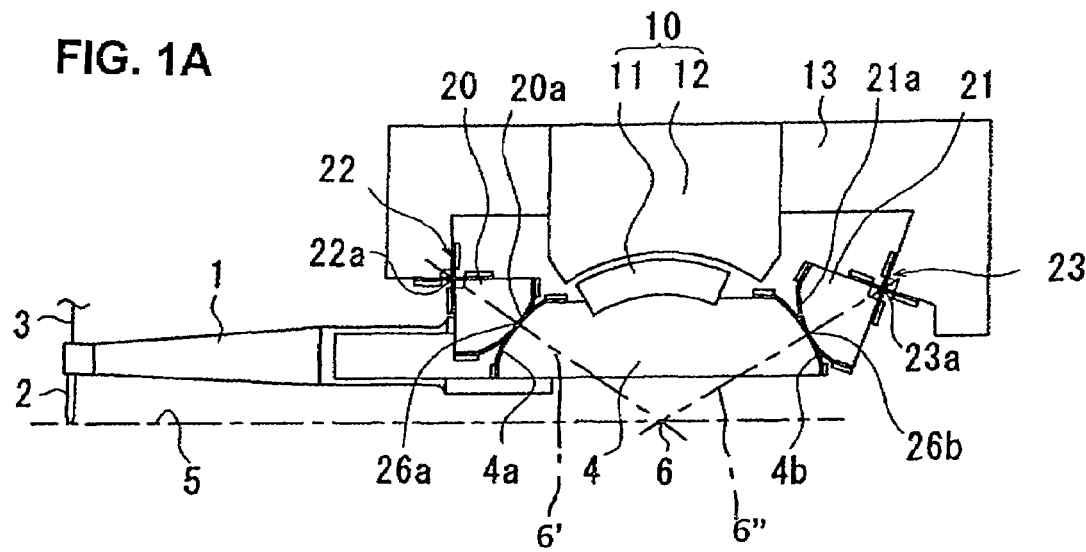
FIGS. 1A and 1B show the first embodiment of the horn-holder pivot type bonding apparatus according to the present invention, FIG. 1A being a side elevational view thereof, and FIG. 1B being an enlarged illustration of the horn holder and bonding head.
Figure 1B:
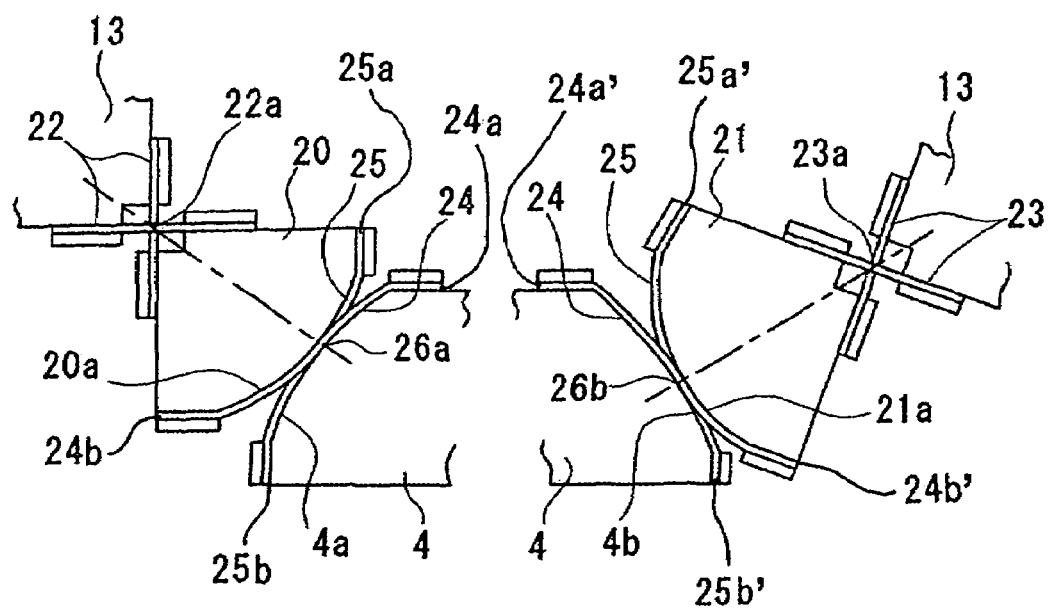

The first embodiment of the horn-holder pivot type bonding apparatus according to the present invention is shown in FIGS. 1A and 1B.

The bonding apparatus includes an ultrasonic horn 1, and a capillary 2 is secured to the tip end of this ultrasonic horn 1. A bonding wire ("wire") 3 wound on a wire spool (not shown in the drawings) is brought to pass through the capillary 2. The ultrasonic horn 1 is held by a horn holder 4; and, in this horn holder 4, circular arc sections 4a and 4b are formed. More specifically, the horn holder 4 has two front circular arc sections 4a, and they are respectively provided on the side surfaces of the horn holder 4 (two front circular arc sections 4a being provided with the horn holder 4 in between, and FIGS. 1A and 1B respectively showing only one of the two front circular arc sections 4a); and the horn holder 4 has also two rear circular arc sections 4b, and they are respectively provided on the side surfaces of the rear end portion of the horn holder 4 (two rear circular arc sections 4a being provided with the horn holder 4 in between FIGS. 1A and 1B respectively showing only one of the two rear circular arc sections 4b). The front and rear circular arc sections 4a and 4b are provided on the forward portion and rearward portion, respectively, with respect to an imaginary pivot point 6 which is positionally fixed on a bonding surface 5 (In other words, the imaginary pivot point 6 is located at substantially the center between the front circular arc section 4a and the rear circular section 4b). It is designed so that when the capillary 2 is lowered to come into contact with the bonding surface 5, the center axis of the capillary 2 is vertical.

Between the front and rear circular arc sections 4a and 4b of the horn holder 4, a movable element 11 of a motor 10 is secured. In other words, the motor 10 is comprised of a movable element 11 and a motor stator ("stator") 12; and the movable element 11 of the motor 10 is secured to the horn holder 4 so as to be between the two circular arc sections 4a and 4b, and the stator 12 of the motor 10 is secured to a bonding head 13. The motor 10 is a motor that has a pulling force between the movable element 11 and the stator 12, and the opposing surfaces of the movable element 11 and stator 12 are, respectively, formed in a circular arc shape centered on the imaginary pivot point 6. Furthermore, though not shown in the drawings, the upper surface of the bonding head 13 is secured to an XY table having a top surface which is driven in an XY axis directions or horizontal direction, and the XY table is secured to the frame of a bonding apparatus. As a result, the bonding head 13 is driven to move in the XY directions or horizontal direction.

The bonding head 13 is provided with forward and rearward cams 20 and 21 respectively having circular arc sections 20a and 21a formed therein so that the circular arc sections (forward and rearward circular arc sections) 20a and 21a positionally correspond respectively to the front and rear circular arc sections 4a and 4b of the horn holder 4. More specifically, the bonding head 13 has two forward cams 20, and they are provided so that they are respectively located spacedly on the side surfaces of the horn holder 4 (two forward cams 20 being provided with the horn holder 4 in between spacedly, and FIGS. 1A and 1B respectively showing only one of the two forward cams 20); and the bonding head 13 has also two rearward cams 21, and they are provided so that they are respectively located spacedly on the side surfaces of the rear end portion of the horn holder 4 (two rearward cams 21 being provided with the horn holder 4 in between spacedly, and FIGS. 1A and 1B respectively showing only one of the two rearward cams 21). The forward and rearward cams 20 and 21 are supported, so as to pivot freely or in pivotable fashion, by cross plate springs (also called "crossed plate springs") 22 and 23, respectively, which are of a commonly known structure.

The front and rear circular arc sections 4a and 4b of the horn holder 4 and the forward and rearward circular arc sections 20a and 21a of the forward and rearward cams 20 and 21 of the bonding head 13 are respectively connected by cross plate springs 24 and 25 provided along the circular arc sections 4a and 20a and along the circular arc sections 4b and 21a. More specifically, one end 24a of one of the cross plate springs 24 (front cross plate spring 24) is secured to the front upper portion of the horn holder 4, and the other end 24b of this front plate spring 24 is secured to the lower portion of the forward cam 20 of the bonding head 13; and likewise, one end 24a' of the other cross plate spring 24 (rear cross plate spring 24) is secured to the rear upper portion of the horn holder 4, and the other end 24b' of this rear plate spring 24 is secured to the lower portion of the rearward cam 21 of the bonding head 13. Furthermore, one end 25a of one of the cross plate springs 25 (front cross plate spring 25) is secured to the forward cam 20 on the bonding head 13, and the other end 25b of this front plate spring 25 is secured to the front lower portion of the horn holder 4; and likewise, one end 25a' of the other cross plate spring 25 (rear cross plate spring 25) is secured to the rearward cam 21 on the bonding head 13, and the other end 25b' of this rear plate spring 25 is secured to the rear lower portion of the horn holder 4.

Furthermore, the forward and rearward cams 20 and 21 are provided on the bonding head 13 so that the respective crossing points 26a and 26b of the cross plate springs 24 and 25 are respectively located on imaginary lines 6' and 6" that respectively connecting the imaginary pivot point 6 and the supporting shafts 22a and 23a of the cross plate springs 22 and 23.

With the structure described above, when the bonding apparatus is not in operation (turned OFF situation), the movable element 11 of the motor 10 is kept pulled in to the stator 12 by the pulling force of the motor 10, and the horn holder 4 is pressed and held against the forward and rearward cams 20 and 21 by the cross plate springs 24 and 25.

When a drive current is supplied to the motor 10 to move the capillary 2 up and down when the bonding apparatus is in operation (turned ON situation), the horn holder 4, together with the movable element 11 of the motor 10, pivots about the imaginary pivot point 6 as a center. In the shown embodiment, because the forward and rearward cams 20 and 21 are provided so that they are pivotable about the respective supporting shafts 22a and 23a of the cross plate springs 22 and 23 as respective centers, the horn holder 4 pivots with the horn holder 4 and the forward and rearward cams 20 and 21 being in contact with and rolling along the front and forward circular arc sections 4a and 20a and the rear and rearward circular arc sections 4b and 21a. As a result, the capillary 2 is moved up and down, and the wire 3 passing through the capillary 2 is bonded to the work.

In the above-described structure, the motor 10 is provided on substantially the center (in the direction of the length of the horn holder 4) of the upper portion of the horn holder 4 and substantially directly above the imaginary pivot point 6, so that the motor 10 is located near the imaginary pivot point. Accordingly, the moment of inertia during the up-and-down movement of the capillary 2 can be reduced, and also the bonding apparatus can be made smaller or downsized. Moreover, the horn holder 4 and the forward and rearward cams 20 and 21 of the bonding head 13 are connected by the cross plate springs 24 and 25. Accordingly, rigidity against the acceleration in the X axis direction is obtained because of the existence of the cross plate springs 24 and 25 (X axis direction is, as described above, a horizontal direction horizontally at right angles with respect to the axial or lengthwise direction of the horn holder and thus perpendicular to the surface of the drawing sheet).

Figure 2A:
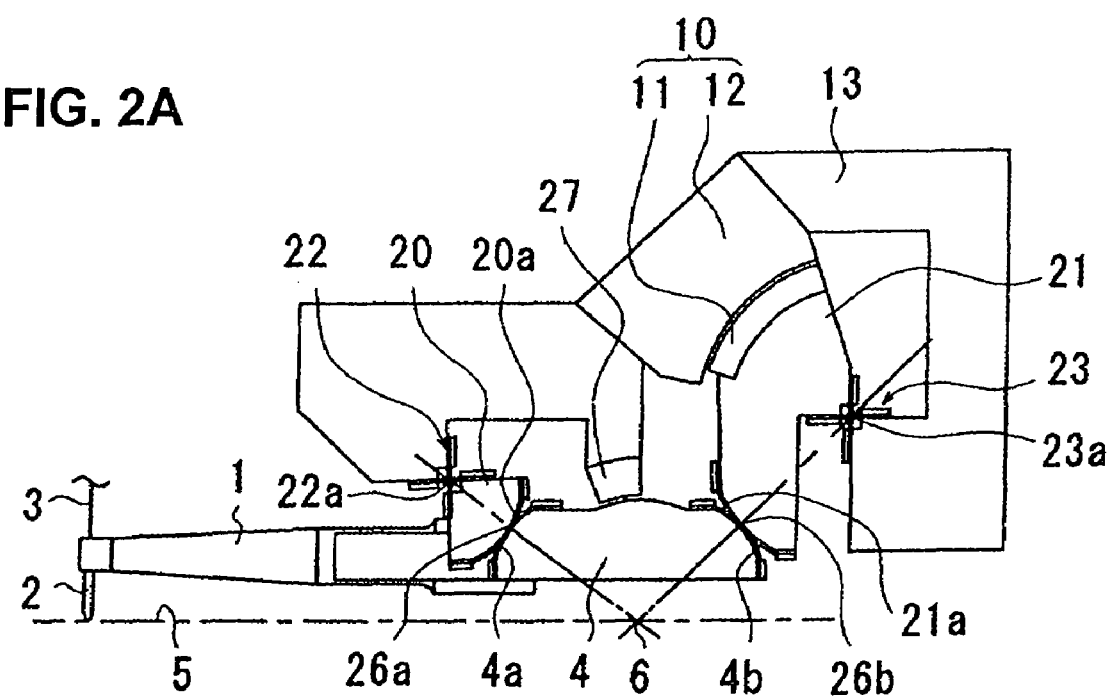
FIGS. 2A and 2B show the first embodiment of the horn-holder pivot type bonding apparatus according to the present invention, FIG. 2A being a side elevational view thereof, and FIG. 2B being an enlarged illustration of the horn holder and bonding head.
Figure 2B:
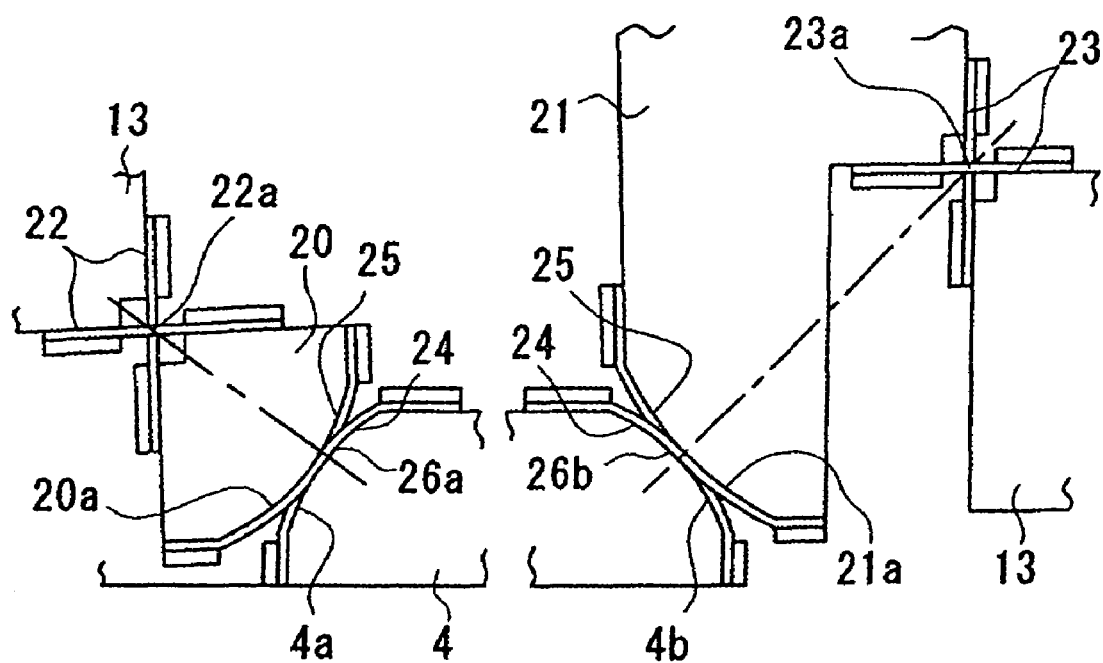

The second embodiment of the horn-holder pivot type bonding apparatus according to the present invention is shown in FIGS. 2A and 2B. Constituting elements and portions that are the same as or correspond to those in the above-described first embodiment of FIGS. 1A and 1B are indicated by the same symbols, and no further description thereof will be given below.

In the first embodiment, the movable element 11 of the motor 10 having a pulling force between its movable element 11 and stator 12 is secured to the horn holder 4. In this second embodiment, however, the movable element 11 is secured to the rearward cam 21. Furthermore, the opposing surfaces of the movable element 11 of the motor 10 and of the stator 12 in the second embodiment are formed in a circular arc shape centered on the supporting shaft 23a of the respective cross plate springs 23.

In this second embodiment, the motor 10 is provided on the upper portion of the rearward cam 21 as seen from FIG. 2A. However, in such a structure, the force securing the horn holder 4 upward would be weak; accordingly, for compensation purposes, a magnet 27 is provided to a part of the bonding head 13 that corresponds to substantially the center (in the direction of the length of the horn holder 4) of the horn holder 4. Instead of providing the magnet 27, the circular arc sections 20a and 21a of the cams 20 and 21 of the bonding head 13 can be made to have a pulling force.

In this second embodiment as well, when a drive current is supplied to the motor 10, the horn holder 4 pivots about the imaginary pivot point 6 as a center, and the capillary 2 moves up and down. Furthermore, the motor 10 is provided above the horn holder 4 and on the upper portion of the rearward cam 21 of the bonding head 13; accordingly, as in the above-described first embodiment, the moment of inertia during the up-and-down drive of the capillary 2 can be reduced, and it is possible to make the bonding apparatus smaller or downsized. Furthermore, since the horn holder 4 and the forward and rearward cams 20 and 21 of the bonding head 13 are connected by the cross plate springs 24 and 25, rigidity against the acceleration in the X axis direction is obtained.

Figure 3A:
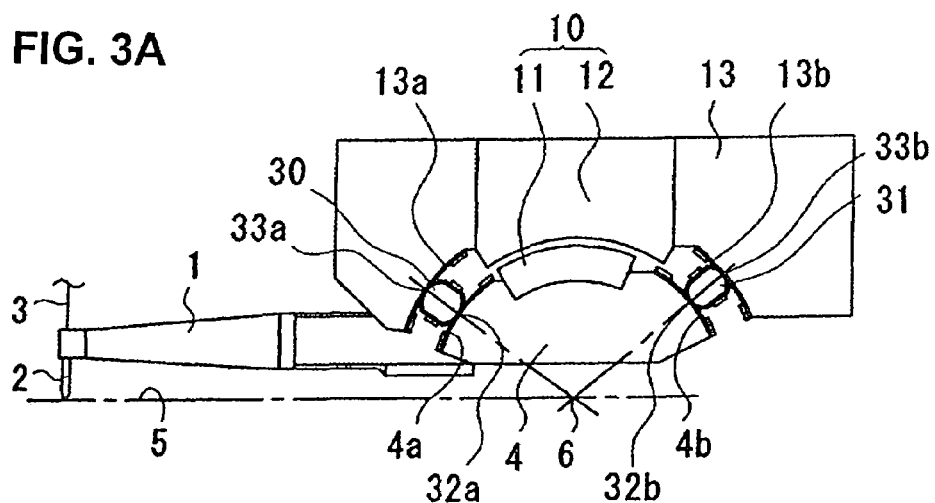
FIGS. 3A and 3B show the first embodiment of the horn-holder pivot type bonding apparatus according to the present invention, FIG. 3A being a side elevational view thereof, and FIG. 3B being an enlarged illustration of the horn holder and bonding head.
Figure 3B:
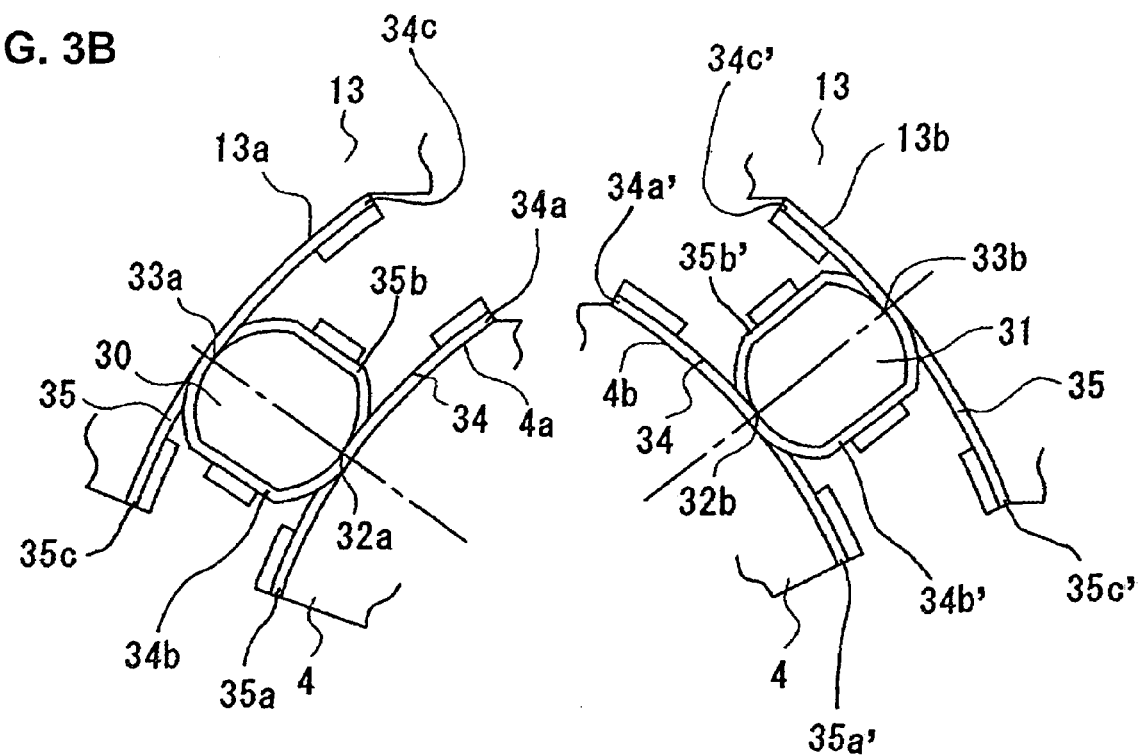

The third embodiment of the horn-holder pivot type bonding apparatus according to the present invention is shown in FIGS. 3A and 3B.

In this third embodiment, as in the above-described first embodiment of FIGS. 1A and 1B, the movable element 11 of the motor 10 that has a pulling force between its movable element 11 and its (motor) stator 12 is secured to the upper end, substantially in the center, of the horn holder 4. In this third embodiment, though the connecting relationship between the horn holder 4 and the bonding head 13 differs from the first embodiment, the horn holder 4 is, as in the first embodiment, provided with circular arc sections 4a and 4b at its forward and rearward portions, respectively.

In this third embodiment, the bonding head 13 is formed with circular arc sections 13a and 13b so that they are at portions corresponding to the circular arc sections 4a and 4b of the horn holder 4 and separated from the circular arc sections 4a and 4b, respectively, by a certain distance. The circular arc shape of the sections 13a and 13b of the bonding head 13 is centered on the imaginary pivot point 6.

In addition, columnar elements 30 and 31 are respectively provided between the circular arc sections 4a and 13a and the circular arc sections 4b and 13b, respectively. More specifically, the (front) columnar element 30 is provided between the front circular arc section 4a of the horn holder 4 and the forward circular arc section 13a of the bonding head 13; and likewise, the (rear) columnar element 31 is provided between the rear circular arc section 4b of the horn holder 4 and the rearward circular arc section 13b of the bonding head 13.

More specifically, one end 34a of one of the cross plate springs 34 (front cross plate spring 34) is secured to the upper portion of the front circular arc section 4a of the horn holder 4, the central part 34b thereof is provided along (the lower side of) the front columnar element 30, and the other end 34c of this front plate spring 34 is secured to the upper portion of the forward circular arc section 13a of the bonding head 13; and likewise, one end 34a' of the other cross plate spring 34 (rear cross plate spring 34) is secured to the upper portion of the rear circular arc section 4b of the horn holder 4, the central part 34b' thereof is provided along (the lower side of) the rear columnar element 31, and the other end 34c' of this rear plate spring 34 is secured to the upper portion of the rearward circular arc section 13b of the bonding head 13.

Furthermore, one end 35a of one of the cross plate springs 35 (front cross plate spring 35) is secured to the lower portion of the front circular arc section 4a of the horn holder 4, the central part 35b thereof is provided along (the upper side of) the front columnar element 30, and the other end 35c of this front plate spring 35 is secured to the lower portion of the forward circular arc section 13a of the bonding head 13; and likewise, one end 35a' of the other cross plate spring 35 (rear cross plate spring 35) is secured to the lower portion of the rear circular arc section 4b of the horn holder 4, the central part 35b' thereof is provided along (the upper side of) the rear columnar element 31, and the other end 35c' of this rear plate spring 35 is secured to the lower portion of the rearward circular arc section 13b of the bonding head 13.

In the above structure, the intersection of downward extensions of lines connecting the (front) crossing points 33a and 32a and the (rear) crossing points 33b and 32b is positionally fixed on the imaginary pivot point 6.

As can be understood from the structure of FIGS. 1A and 1B, in the third embodiment of the present invention as well, the horn holder 4 has two front circular arc sections 4a and two rear circular arc sections 4b, the bonding head 13 has two front circular arc sections 13a and two rear circular arc sections 13b so as to be on both sides of the horn holder 4, two front columnar elements 30 and two rear columnar elements 31 are respectively provided between the bonding head 13 and the horn holder 4, and two front cross plate springs 34 and two rear cross plate springs 35 are employed for the columnar elements 30 and 31. FIGS. 3A and 3B respectively show only one of the two front circular arc sections 13, front circular arc sections 4a, front columnar elements 30 and front cross plate springs 34; and only one of the two rear circular arc sections 13*b*, rear circular arc sections 4*b*, rear columnar elements 31 and rear cross plate springs 35.

In this third embodiment as well, the movable element 11 of the motor is, as in the above-described first embodiment of FIGS. 1A and 1B, always pulled in to the (motor) stator 12 of the motor 11 by the pulling force of the motor 10, and the horn holder 4 is held in the bonding head 13 via the cross plate springs 34 and 35 and columnar elements 30 and 31.

When a drive current is supplied to the motor 10 to move the capillary 2 up and down while the bonding apparatus is in operation (turned ON situation), the horn holder 4, together with the movable element 11 of the motor 10, pivots about the imaginary pivot point 6 as a center. In other words, the horn holder 4 pivots with the columnar elements 30 and 31 being in contact with and rolling along the circular arc sections 4*a* and 4*b* of the horn holder 4 and the circular arc sections 13*a* and 13*b* of the bonding head 13 due to the cross plate springs 34 and 35.

As seen from the above, in the structure of the third embodiment as well, the motor 10 is provided on substantially the (lengthwise) center of the upper portion of the horn holder 4 and substantially directly above the imaginary pivot point 6 as in the above-described first embodiment (FIGS. 1A and 1B). Accordingly, the moment of inertia during the up-and-down movement of the capillary 2 can be reduced, and also the bonding apparatus can be made smaller or downsized. Moreover, since the horn holder 4 and the bonding head 13 are connected by the columnar elements 30 and 31 and cross plate springs 34 and 35, due to the existence of the cross plate springs 34 and 35, rigidity against the acceleration in the X axis direction is obtained.

Figure 4A:
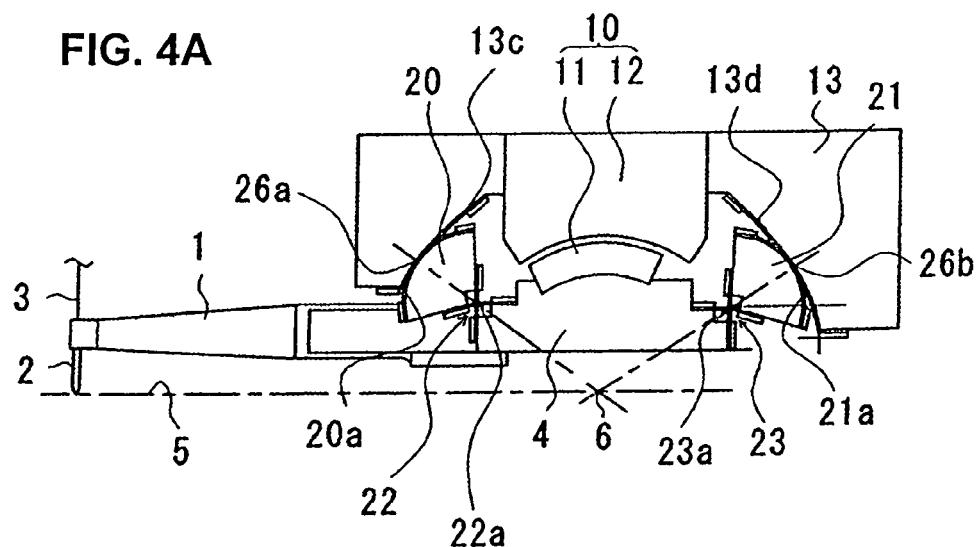
FIGS. 4A and 4B show the first embodiment of the horn-holder pivot type bonding apparatus according to the present invention, FIG. 4A being a side elevational view thereof, and FIG. 4B being an enlarged illustration of the horn holder and bonding head.
Figure 4B:
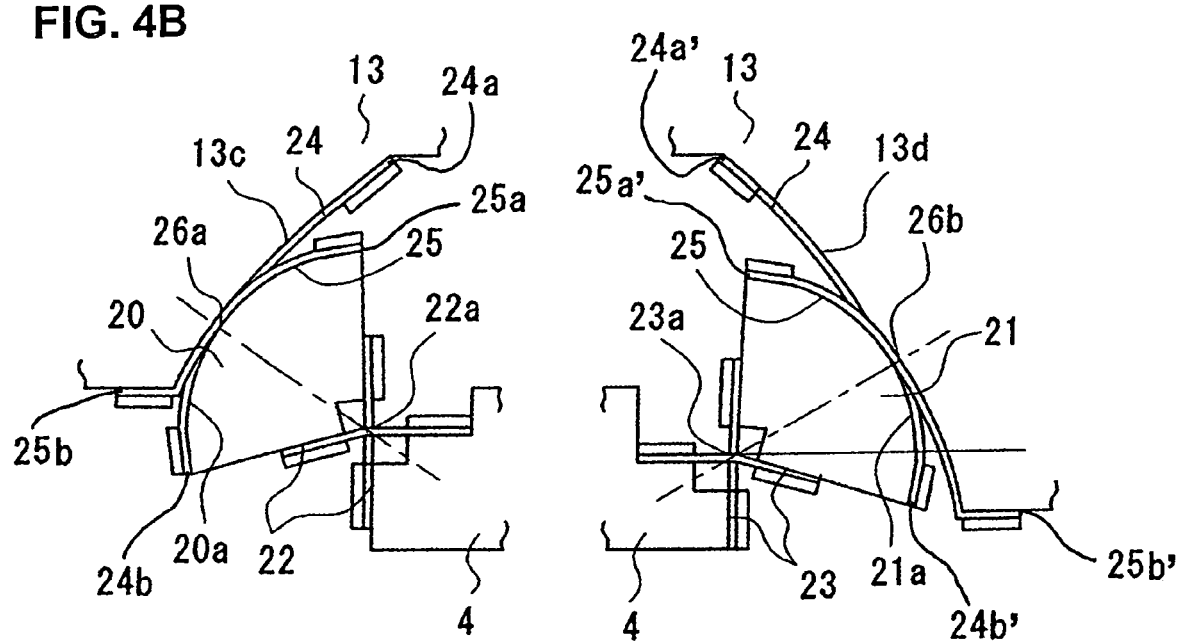

The fourth embodiment of the horn-holder pivot type bonding apparatus according to the present invention is shown in FIGS. 4A and 4B. In this fourth embodiment, only the relationship between the forward and rearward cams 20 and 21, the horn holder 4 and bonding head 13 is the reverse of that in the above-described first embodiment (FIGS. 1A and 1B), and the rest of the structure is substantially the same as that shown in FIGS. 1A and 1B.

More specifically, the forward and rearward cams 20 and 21 are provided on the horn holder 4 (and not on the bonding head 13), and these cams 20 and 21 are pivotably installed by cross plate springs 22 and 23. The forward and rearward cams 20 and 21 respectively have circular arc sections 20*a* and 21*a* with their circular arc shape being centered on the respective supporting shafts 22*a* and 23*a*. In the bonding head 13, at portions corresponding to the forward and rearward cams 20 and 21 of the horn holder 4, circular arc sections 13*c* and 13*d* are formed with the circular arc shape thereof being centered on the imaginary pivot point 6.

The circular arc sections 20*a* and 21*a* of the forward and rearward cams 20 and 21 and the circular arc sections 13*c* and 13*d* of the bonding head 13 are connected by the cross plate springs 24 and 25 provided along the circular arc sections 20*a* and 13*c* and 21*a* and 13*d*. More specifically, one end 24*a* of one of the cross plate springs 24 (front cross plate spring 24) is secured to the upper portion of the front circular arc section 13*c* of the bonding head 13, and the other end 24*b* of this front plate spring 24 is secured to the lower portion of the forward cam 20 on the horn holder 4; and likewise, one end 24*a*' of the other cross plate spring 24 (rear cross plate spring 24) is secured to the upper portion of the rear circular arc section of the bonding head 13, and the other end 24*b*' of this rear plate spring 24 is secured to the lower portion of the rearward cam 21 of the horn holder 4. Furthermore, one end 25*a* of one of the cross plate springs 25 (front cross plate spring 25) is secured to the upper portion of the forward cam 20 on the horn holder 4, and the other end 25*b* of this front plate spring 25 is secured to the front lower portion of the bonding head 13; and likewise, one end 25*a*' of the other cross plate spring 25 (rear cross plate spring 25) is secured to the upper portion of the rearward cam 21 on the horn holder 14, and the other end 25*b*' of this rear plate spring 25 is secured to the rear lower portion of the bonding head 13.

In this structure, the forward and rearward cams 20 and 21 installed on the horn holder 4 are provided so that the crossing points 26*a* and 26*b* of the cross plate springs 24 and 25 are on lines connecting the imaginary pivot point 6 and the center of the respective cross plate springs 22 and 23.

In the above-described structure of the fourth embodiment, the movable element 11 of the motor 10 is constantly pulled in to the (motor) stator 12 by the pulling force of the motor 10; and in the horn holder 4, the forward and rearward cams 20 and 21 supported by the cross plate springs 22 and 23 are pressed against the bonding head 13 by the cross plate springs 24 and 25 and thus held thereby.

When a drive current is supplied to the motor 10 to move the capillary 2 up and down while the bonding apparatus is in operation (turned ON situation), the horn holder 4, together with the movable element 11 of the motor 10, pivots about the imaginary pivot point 6 as a center. In the structure of this embodiment, the forward and rearward cams 20 and 21 on the horn holder 4 are respectively provided so that they are pivotable about the supporting shafts 22*a* and 23*a* of the cross plate springs 22 and 23 as respective centers; accordingly, the horn holder 4 pivots with the cross plate springs 24 and 25 being in contact with and rolling along the circular arc sections 20*a* and 21*a* of the forward and rearward cams 20 and 21 and the circular arc sections 13*c* and 13*d* of the bonding head 13, respectively. As a result, the capillary 2 is moved up and down, and the wire 3 passing through the capillary 2 is bonded to the work.

As seen from the above, the same advantages provided by the above-described first embodiment are obtained by the structure of this fourth embodiment. In other words, because the motor 10 is provided at substantially the center of the upper portion of the horn holder 4 and substantially directly above the imaginary pivot point 6 so that the motor 10 is located near the imaginary pivot point, the moment of inertia during the up-and-down movement of the capillary 2 can be reduced, and also the bonding apparatus can be made smaller or downsized.

Moreover, the forward and rearward cams 20 and 21 attached by the cross plate springs 22 and 23 to the horn holder 4 are connected to the bonding head 13 by the cross plate springs 24 and 25. Accordingly, rigidity against the acceleration in the X axis direction is obtained due to the existence of the cross plate springs 24 and 25.

Figure 5A:
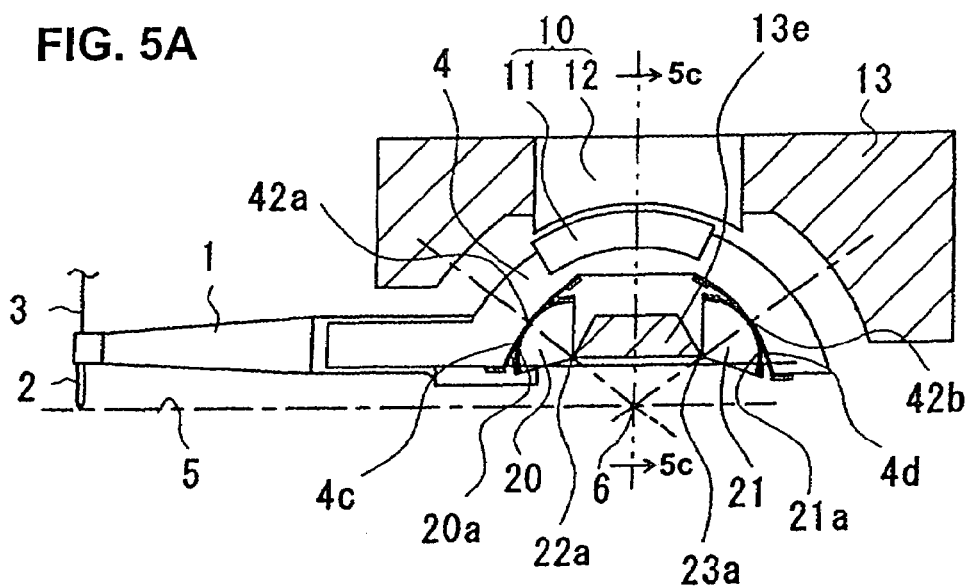
FIGS. 5A, 5B and 5C show the first embodiment of the horn-holder pivot type bonding apparatus according to the present invention, FIG. 5A being a side elevational view thereof, FIG. 1B being an enlarged illustration of the horn holder and bonding head, and FIG. 1C being a cross sectional view taken along the line 5C-5C in FIG. 1A.
Figure 5B:
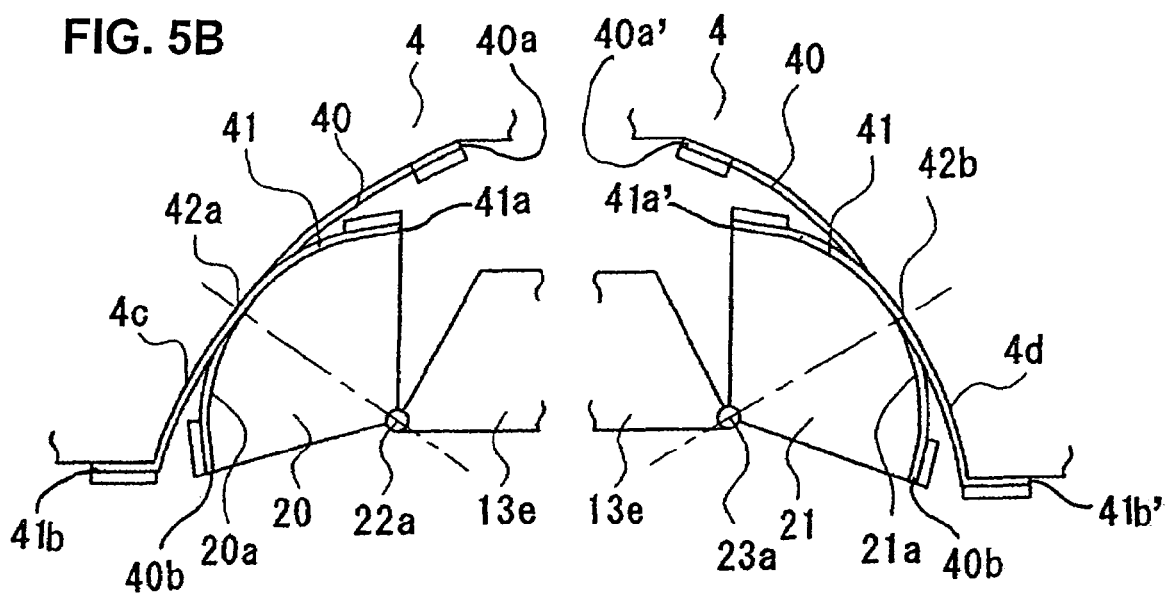
Figure 5C:
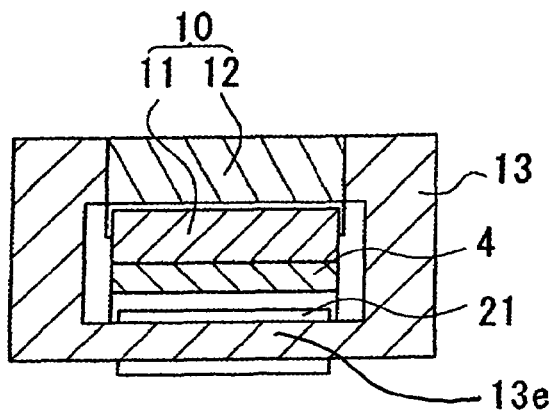

The fifth embodiment of the horn-holder pivot type bonding apparatus of the present invention will be described with reference to FIGS. 5A through 5C.

In the embodiments described above, the forward and rearward upper portions of the horn holder 4 are supported by the bonding head 13. In this fifth embodiment, however, the bonding head 13 has a horn holder support 13*e* that supports the horn holder 4, and this horn holder support 13*e* is provided above the imaginary pivot point 6. In the fifth embodiment, the motor 10 has no pulling force between its stator and movable element; and the movable element 11 of the motor 10 is secured at substantially the center of the horn holder 4, and the (motor) stator 12 is secured to the bonding head 13.

More specifically, the horn holder support 13*e* of the bonding head 13 is provided with forward and rearward cams 20 and 21 so that they are pivotable by the respective supporting shafts 22a and 23a disposed at the forward portion and rearward portion of the horn holder support 13e. The forward and rearward cams 20 and 21 are respectively formed with circular arc sections 20a and 21a so that the circular arc shape thereof is centered on the respective supporting shafts 22a and 23a. The horn holder 4 is, at portions corresponding to the forward and rearward cams 20 and 21 on the horn holder support 13e of the bonding head 13, provided with circular arc sections 4c and 4d so that the circular arc shape thereof is centered on the imaginary pivot point 6.

The circular arc sections 20a and 21a of the forward and rearward cams 20 and 21 and the circular arc sections 4c and 4d of the horn holder 4 are connected by cross plate springs 40 and 41 provided along the circular arc sections 20a and 4c and circular arc sections 21a and 4d, respectively. More specifically, one end 40a of one of the cross plate springs 40 (front cross plate spring 40) is secured to the upper portion of the front circular arc portion of horn holder 4, and the other end 40b of this front plate spring 40 is secured to the lower portion of the circular arc portion of the forward cam 20 on the horn holder support 13e of the bonding head 13; one end 40a' of the other cross plate spring 40 (rear cross plate spring 40) is secured to the upper portion of rear circular arc portion of the horn holder 4, and the other end 40b' of this rear plate spring 40 is secured to the lower portion of the circular arc portion of the rearward cam 21 on the horn holder support 13e of the bonding head 13. Furthermore, one end 41a of one of the cross plate springs 41 (front cross plate spring 41) is secured to the upper portion of the forward cam 20, and the other end 41b of this front cross plate spring 41 is secured to the front lower portion of the horn holder 4; and likewise, one end 41a' of the other cross plate spring 41 (rear cross plate spring 41) is secured to the upper portion of the rearward cam 21, and the other end 41b' of this rear cross plate spring 41 is secured to the lower portion of rear lower portion of the horn holder 4.

In this structure, the forward and rearward cams 20 and 21 are provided on the horn holder support 13e of the bonding head 13 so that the crossing points 42a and 42b of the cross plate springs 40 and 41 are on lines connecting the imaginary pivot point 6 and the supporting shafts 22a and 23a, respectively.

In the above structure, when a drive current is supplied to the motor 10 to move the capillary 2 up and down while the bonding apparatus is in operation (turned ON situation), the horn holder 4, together with the movable element 11 of the motor 10, pivots about the imaginary pivot point 6 as a center. In the shown embodiment, the forward and rearward cams 20 and 21 are provided so that they are pivotable about the supporting shafts 22a and 23a as respective centers; accordingly, the horn holder 4 pivots with the cross plate springs 40 and 41 being in contact with and rolling along the circular arc sections 20a and 21a of the forward and rearward cams 20 and 21 and the circular arc sections 4c and 4d of the horn holder 4, respectively. As a result, the capillary 2 is moved up and down, and the wire 3 passing through the capillary 2 is bonded to the work.

As seen from the above, because the motor 10 is provided at substantially the center of the upper portion of the horn holder 4 and substantially directly above the imaginary pivot point 6 so that the motor 10 is located near the imaginary pivot point, the moment of inertia during the up-and-down movement of the capillary 2 can be reduced, and also the bonding apparatus can be made smaller or downsized Moreover, because the horn holder 4 and the bonding head 13 are connected by the cross plate springs 40 and 41, rigidity against the acceleration in the X axis direction is obtained due to the existence of the cross plate springs 40 and 41

In the first, second, and fourth embodiments described above and shown in FIGS. 1A and 1B, FIGS. 2Aa and 2B, and FIGS. 4A and 4B, the cross plate springs 24 and 25 are provided. However, in each of these structures, the horn holder 4 is pressed against the forward and rearward cams 20 and 21 by the pulling force of the motor 10; accordingly, the cross plate springs 24 and 25 are not necessarily required to be provided. Nevertheless, with the cross plate springs 24 and 25 provided, rigidity against the acceleration in the X axis direction is obtained, and thus, it is preferable that the cross plate springs 24 and 25 be provided.

Furthermore, in the first, second, and fourth embodiments, the forward and rearward cams 20 and 21 are attached to the bonding head 13 via the cross plate springs 22 and 23. However, the forward and rearward cams 20 and 21 can be attached by supporting shafts such as pins or the like.

The invention claimed is:

1. A horn-holder pivot type bonding apparatus comprising:
a capillary;
an ultrasonic horn holding said capillary at one end thereof;
a horn holder holding another end of said ultrasonic horn, said horn holder being provided with each of circular arc sections at a forward portion and at a rearward portion thereof, and each circular arc shape of said circular arc section being centered on a virtual pivot point positionally fixed on a bonding surface;
a drive means for driving said horn holder to pivot about said virtual pivot point, said drive means being provided one of at substantially a center of an upper portion of said horn holder and above a rear-side portion of said horn holder; and
a bonding head, driven in XY directions, provided with each of forward and rearward cams pivotally supported by supporting shafts at portions corresponding to said circular arc sections of said horn holder, each of said cams having circular arc sections being in contact with each of said circular arc sections of said horn holder, and each circular arc shape of said circular arc section of said cam being centered on each of said supporting shafts.

2. The horn-holder pivot type bonding apparatus according to claim 1, wherein
said circular arc section of said forward portion of said horn holder and said circular arc section of said forward cam of said bonding head are connected by cross plate springs, and
said circular arc section of said rearward portion of said horn holder and said circular arc section of said rearward cam of said bonding head are connected by cross plate springs.

3. A horn-holder pivot type bonding apparatus comprising:
a capillary;
an ultrasonic horn holding said capillary at one end thereof;
a horn holder holding another end of said ultrasonic horn, said horn holder being provided with each of circular arc sections at a forward portion and at a rearward portion thereof, and each circular arc shape of said circular arc section being centered on a virtual pivot point positionally fixed on a bonding surface;
a drive means for driving said horn holder to pivot about said virtual pivot point, said drive means being provided one of at substantially a center of an upper portion of said horn holder and above a rear-side portion of said horn holder;
a bonding head, driven in XY directions, provided with each of circular arc sections at portions corresponding to said circular arc sections of said horn holder, each circular arc shape of said circular arc section of said bonding head being centered on said virtual pivot point, and each of said circular arc sections of said bonding head being separated by a certain distance from said circular arc sections of said horn holder; and a plurality of columnar elements respectively provided between said circular arc sections of said horn holder and said circular arc sections of said bonding head, each of said circular arc sections of said horn holder and each of said circular arc sections of said bonding head being connected by cross plate springs with said columnar elements in between.

4. A horn-holder pivot type bonding apparatus comprising:

a capillary;

an ultrasonic horn holding said capillary at one end thereof;

a horn holder holding another end of said ultrasonic horn, said horn holder being provided with each of forward and rearward cams pivotally supported by supporting shafts at a forward portion and at a rearward portion thereof, each of said earns being formed with circular arc sections, and each circular arc shape of said circular arc section of said cam being centered on each of said supporting shafts;

a drive means for driving said horn holder to pivot about a virtual pivot point positionally fixed on a bonding surface, said drive means being provided one of at substantially a center of an upper portion of said horn holder and above a rear-side portion of said horn holder; and a bonding head, driven in XY directions, provided with each of circular arc sections at portions corresponding to said circular arc sections of each of said cams, each circular arc shape of said circular arc section of said bonding head being centered on said virtual pivot point, and each of said circular arc sections of said bonding head being in contact with each of said cams.

5. The horn-holder pivot type bonding apparatus according to claim 4, wherein said circular arc sections of each of said cams and said circular arc sections of said bonding head are connected by cross plate springs.

6. A horn-holder pivot type bonding apparatus comprising:

a capillary;

an ultrasonic horn holding said capillary at one end thereof;

a horn holder holding another end of said ultrasonic horn, said horn holder being provided with each of circular arc sections so as to contact each of circular arc sections of each of forward and rearward cams pivotally supported by supporting shafts at portions corresponding to said circular are sections of each of said cams, each circular arc shape of said circular arc section of said horn holder being centered on a virtual pivot point positionally fixed on a bonding surface, and said horn holder being provided above each of said supporting shafts;

a drive means for driving said horn holder to pivot about said virtual pivot point, said drive means being provided one of at substantially a center of an upper portion of said horn holder and above a rear-side portion of said horn holder; and a bonding head provided with a horn holder support above said virtual pivot point, said horn holder support being provided with each of said cams pivotally supported by said supporting shafts, each of said cams having circular arc sections, and each circular arc shape of said circular arc section being centered on each of said supporting shafts.

7. The horn-holder pivot type bonding apparatus according to claim 6, wherein said circular arc sections of each of said cams and said circular arc sections of said horn holder are connected by cross plate springs.

8. The horn-holder pivot type bonding apparatus according to claim 1, wherein said drive means is a motor having a pulling force between a stator thereof and a movable element thereof, and one of said stator and movable element is secured to one of said horn holder and a member that pivots together with said horn holder, and other of said stator and movable element is secured to said bonding head driven in said XY directions.

9. The horn-holder pivot type bonding apparatus according to claim 3, wherein said drive means is a motor having a pulling force between a stator thereof and a movable element thereof, and one of said stator and movable element is secured to one of said horn holder and a member that pivots together with said horn holder, and other of said stator and movable element is secured to said bonding head driven in said XY directions.

10. The horn-holder pivot type bonding apparatus according to claim 4, wherein said drive means is a motor having a pulling force between a stator thereof and a movable element thereof, and one of said stator and movable element is secured to one of said horn holder and a member that pivots together with said horn holder, and other of said stator and movable element is secured to said bonding head driven in said XY directions.

11. The horn-holder pivot type bonding apparatus according to claim 6, wherein said drive means is a motor without pulling force between a stator thereof and a movable element thereof, and one of said stator and movable element is secured to said horn holder, and other of said stator and movable element is secured to said bonding head driven in said XY directions.

12. The horn-holder pivot type bonding apparatus according to claim 8, wherein opposing surfaces of said stator and movable member are respectively formed in a circular arc shape centered on said virtual pivot point.

13. The horn-holder pivot type bonding apparatus according to claim 9, wherein opposing surfaces of said stator and movable member are respectively formed in a circular arc shape centered on said virtual pivot point.

14. The horn-holder pivot type bonding apparatus according to claim 10, wherein opposing surfaces of said stator and movable member are respectively formed in a circular arc shape centered on said virtual pivot point.

15. The horn-holder pivot type bonding apparatus according to claim 11, wherein opposing surfaces of said stator and movable member are respectively formed in a circular arc shape centered on said virtual pivot point.

* * * * *